(12) United States Patent
Gendelman

(10) Patent No.: US 11,448,679 B2
(45) Date of Patent: Sep. 20, 2022

(54) SYSTEM AND METHOD FOR TESTING A TRACTOR TRAILER

(71) Applicant: Allan Gendelman, Garfield, NJ (US)

(72) Inventor: Allan Gendelman, Garfield, NJ (US)

( * ) Notice: Subject to any disclaimer, the term of this patent is extended or adjusted under 35 U.S.C. 154(b) by 538 days.

(21) Appl. No.: 16/720,057

(22) Filed: Dec. 19, 2019

(65) Prior Publication Data

US 2021/0190846 A1  Jun. 24, 2021

(51) Int. Cl.
| | | |
|---|---|---|
| *G01R 31/00* | (2006.01) | |
| *G07C 5/08* | (2006.01) | |
| *G01R 31/70* | (2020.01) | |
| *G01R 31/302* | (2006.01) | |
| *B60T 17/22* | (2006.01) | |
| *B60Q 1/30* | (2006.01) | |
| *H01R 29/00* | (2006.01) | |

(52) U.S. Cl.
CPC .......... *G01R 31/007* (2013.01); *B60Q 1/305* (2013.01); *B60T 17/221* (2013.01); *B60T 17/226* (2013.01); *G01R 31/3025* (2013.01); *G01R 31/70* (2020.01); *G07C 5/0841* (2013.01); *H01R 29/00* (2013.01); *H01R 2201/26* (2013.01)

(58) Field of Classification Search
CPC .. G01R 31/007; G01R 31/70; G01R 31/3025; H01R 29/00; H01R 2201/26; B60Q 1/305; B60T 17/221; B60T 17/226; G07C 5/0841
See application file for complete search history.

(56) References Cited

U.S. PATENT DOCUMENTS

| | | | | |
|---|---|---|---|---|
| 5,397,924 A | * | 3/1995 | Gee | B60D 1/62 340/3.1 |
| 6,007,346 A | * | 12/1999 | Gutierrez | H01R 29/00 439/35 |
| 6,265,878 B1 | * | 7/2001 | Traub | G01R 31/006 324/504 |

(Continued)

FOREIGN PATENT DOCUMENTS

| | | | | |
|---|---|---|---|---|
| CA | 2188993 A1 | * | 1/1996 | G08C 19/00 |
| CA | 2558622 A1 | * | 2/2007 | B60Q 1/305 |

(Continued)

*Primary Examiner* — Calvin Cheung
(74) *Attorney, Agent, or Firm* — Michael J. Feigin, Esq.; Feigin and Fridman LLC

(57) ABSTRACT

A system and method for testing a tractor trailer is disclosed. The system includes a housing having connections for establishing an electrical and pressure connection to the electrical system and ABS of a tractor trailer, respectively, a circuit board that generates electrical signals and pressure signals corresponding to the connections, an electronic device for displaying the electrical signals and pressure signals, a wireless transceiver for transmitting the electrical signals and pressure signals to the electronic device, and a memory for storing the transmitted electrical signals and pressure signals. The method includes connecting the tractor trailer electrical system and ABS connections to the housing, powering on the tractor trailer, querying an electrical signal and/or pressure signal of the electrical system and ABS, wirelessly transmitting the electrical signal and/or pressure signal to an electronic device, and displaying the electrical signal and/or pressure signal on the electronic device.

20 Claims, 3 Drawing Sheets

(56) References Cited

U.S. PATENT DOCUMENTS

| | | | | |
|---|---|---|---|---|
| 2001/0011891 A1* | 8/2001 | Melendez | ............ | G01R 31/006 |
| | | | | 324/504 |
| 2002/0021213 A1* | 2/2002 | Ehrlich | .................... | B60Q 1/44 |
| | | | | 340/471 |
| 2017/0285084 A1* | 10/2017 | Johnson | ................ | G01R 31/007 |
| 2018/0099712 A1* | 4/2018 | Bean | .................... | G08B 13/126 |

FOREIGN PATENT DOCUMENTS

| | | | | | |
|---|---|---|---|---|---|
| GB | 2399467 | A | * | 9/2004 | ............... B60D 1/62 |
| WO | WO-2014203273 | A1 | * | 12/2014 | ............. H01R 24/30 |
| WO | WO-2019224402 | A1 | * | 11/2019 | ............... B60D 1/62 |

* cited by examiner

SYSTEM AND METHOD FOR TESTING A TRACTOR TRAILER

FIELD OF THE DISCLOSED TECHNOLOGY

The disclosed technology relates to a system and method for testing a tractor trailer. More specifically, the disclosed technology relates to a system and method for remotely testing and diagnosing the controls of a tractor trailer, such as the electrical system and air brake system.

BACKGROUND OF THE DISCLOSED TECHNOLOGY

Tractor trailer testing and diagnostic systems employ a physical apparatus and/or device requiring a direct connection to the electrical system and air brake system, or anti-lock brake system (ABS), of the tractor trailer. Once the tractor trailer is powered, this apparatus then reports the results/diagnosis of these systems. Tractor trailer seven-way plug, single pole and dual pole charge ports corresponding to the electrical system of a tractor trailer and tractor trailer service and emergency air lines corresponding to the ABS of a tractor trailer are located on the exterior of the tractor trailer. Therefore, because the apparatus must be directly connected to the electrical system and ABS, the individual reading the testing/diagnosis must be outside of the tractor trailer while testing the tractor trailer. Thus, in most cases, the testing requires two individuals, one for operating the tractor trailer and the other for reading the results/diagnosis and communicating with the operator. However, it desirable to operate the tractor trailer and read the results at the same time from within the tractor trailer.

Moreover, tractor trailer testing and diagnosis systems do not contain means for retaining data regarding the test/diagnostic results. However, it is desirable to store the test/diagnostic results in order to compare results over time and study trends for the purpose of maintaining a safer and more efficient tractor trailer.

Accordingly, there is a need for a system and method for testing a tractor trailer that enables a user to test a tractor trailer remotely, such as within the tractor trailer, and that includes a means for retaining data over time.

SUMMARY OF THE DISCLOSED TECHNOLOGY

Disclosed herein is a system for testing a tractor trailer including a housing having a seven-way tractor trailer plug port, a two-pole charge port, a single-pole charge port, a service air line port, and an emergency air line port, a circuit board coupled to the seven-way tractor trailer plug port, the two-pole charge port, the single-pole charge port, the service air line port, and the emergency air line port, wherein the circuit board generates electrical signals related to a first circuitry of a tractor trailer, a first lift gate circuitry of a tractor trailer, and a second lift gate circuitry of a tractor trailer, and wherein the circuit board generates pressure signals related to a service air line of a tractor trailer and an emergency air line of a tractor trailer, an electronic device including a graphic user interface comprising a plurality of meters corresponding to the first circuitry, the first lift gate circuitry, the second lift gate circuitry, the service air line and the emergency air line, wherein the plurality of meters display the electrical signals and pressure signals generated by the circuit board, a wireless transceiver coupled to the circuit board to transmit the electrical signals and pressure signals to the electronic device, and a memory to store the transmitted electrical signals and pressure signals.

In embodiments, the tractor trailer testing system includes a housing having a seven-way tractor trailer plug port electrically connectable to a seven-way tractor trailer plug corresponding to a first circuitry of a tractor trailer, a two-pole charge port electrically connectable to a two-pole charger corresponding to a first lift gate circuitry of a tractor trailer, a single-pole charge port electrically connectable to a single-pole charger corresponding to a second lift gate circuitry of a tractor trailer, a service air line port electrically connectable to a service air line of a tractor trailer, and an emergency air line port electrically connectable to an emergency air line of a tractor trailer, a circuit board coupled to the seven-way tractor trailer plug port, the two-pole charge port, the single-pole charge port, the service air line port, and the emergency air line port, wherein the circuit board generates a first electrical signal corresponding to an electrical output of the first circuitry, a second electrical signal corresponding to an electrical output of the first lift gate circuitry, and a third electrical signal corresponding to an electrical output of the second lift gate circuitry, and wherein the circuit board generates a first pressure signal corresponding to a pressure output of the service air line, and a second pressure signal corresponding to a pressure output of an emergency air line of the tractor trailer, an electronic device including a graphic user interface comprising a plurality of meters, the plurality of meters corresponding to the first circuitry, the first lift gate circuitry, the second lift gate circuitry, the service air line, and the emergency air line of a tractor trailer, wherein each of the plurality of meters displays the corresponding electrical signal or pressure signal of the first circuitry, the first lift gate circuitry, the second lift gate circuitry, the service air line, and the emergency air line of the tractor trailer, a wireless transceiver coupled to the circuit board, wherein the wireless transceiver transmits the electrical signal and the pressure signal generated by the circuit board wirelessly to the electronic device, and a memory to store the transmitted electrical signal and pressure signal.

In some embodiments, power provided by the tractor trailer causes the circuit board to receive an electrical output of the first circuitry, an electrical output of the first lift gate circuitry, and an electrical output of the second lift gate circuitry, and the circuit board causes the wireless transceiver to transmit the first electrical signal corresponding to the electrical output of the first circuitry, the second electrical signal corresponding to the electrical output of the first lift gate circuitry, and the third electrical signal corresponding to the electrical output of the second lift gate circuitry to the electronic device.

In certain embodiments, applying pressure to a brake of the tractor trailer causes the circuit board to receive a pressure output of the service air line, and a pressure output of the emergency air line, and the circuit board causes the wireless transceiver to transmit the first pressure signal corresponding to the pressure output of the service air line and the second pressure signal corresponding to the pressure output of the emergency air line to the electronic device.

In embodiments, the first circuitry of the tractor trailer includes an auxiliary light circuitry, a tail/running light circuitry, a clearance/marker light circuitry, a brake light circuitry, a right turn light circuitry, and a left turn light circuitry.

In some embodiments, the first electrical signal comprises an auxiliary light electrical signal corresponding to an electrical output of the auxiliary light circuitry, a tail/running light electrical signal corresponding to an electrical output of the tail/running light circuitry, a clearance/marker light electrical signal corresponding to an electrical output of the clearance/marker light circuitry, a brake light electrical signal corresponding to an electrical output of the brake light circuitry, a right turn electrical signal corresponding to an electrical output of the right turn light circuitry, and a left turn electrical signal corresponding to an electrical output of the left turn light circuitry.

In certain embodiments, the first pressure signal comprises a service brake air pressure signal corresponding to a pressure output of the service brake system of the tractor trailer, a service brake leak down pressure signal corresponding to a pressure output of the service leak down brake system of the tractor trailer, and a trolley brake pressure signal corresponding to a pressure output of the service trolley brake system of the tractor trailer.

In embodiments, the plurality of meters include a first meter corresponding to the auxiliary light circuitry, a second meter corresponding to the tail/running light circuitry, a third meter corresponding to the clearance marker light electrical circuitry, a fourth meter corresponding to the brake light circuitry, a fifth meter corresponding to the right turn light circuitry, a sixth meter corresponding to the left turn light circuitry, a seventh meter corresponding to the first lift gate circuitry, an eighth meter corresponding to the second lift gate circuitry, a ninth meter corresponding to the service brake system of the tractor trailer, a tenth meter corresponding to the service leak down brake system of the tractor trailer, an eleventh meter corresponding to the trolley brake system of the tractor trailer, and a twelfth meter corresponding to the emergency air line of the tractor trailer.

In some embodiments, the first meter displays the auxiliary light electrical signal corresponding to the auxiliary light circuitry, the second meter displays the tail/running light electrical signal corresponding to the tail/running light circuitry, the third meter displays the clearance/marker light electrical signal corresponding to the clearance/marker light circuitry, the fourth meter displays the brake light electrical signal corresponding to the brake light circuitry, the fifth meter displays the right turn electrical signal corresponding to the right turn light circuitry, the sixth meter displays the left turn electrical signal corresponding to the left turn light circuitry, the seventh meter displays the second electrical signal corresponding to the electrical output of the first lift gate circuitry, the eighth meter displays the third electrical signal corresponding to the electrical output of the second lift gate circuitry, a ninth meter displays the service brake air pressure signal corresponding to the service brake system, the tenth meter displays the service brake leak down pressure signal corresponding to the service leak down brake system, the eleventh meter displays the trolley brake pressure signal corresponding to the service trolley brake system, and the twelfth meter displays the pressure signal corresponding to the emergency air line.

In certain embodiments, the first meter further displays a peak auxiliary light electrical signal corresponding to the auxiliary light circuitry, the second meter further displays a peak tail/running light electrical signal corresponding to the tail/running light circuitry, the third meter further displays a peak clearance/marker light electrical signal corresponding to the clearance/marker light circuitry, the fourth meter further displays a peak brake light electrical signal corresponding to the brake light circuitry, the fifth meter further displays a peak right turn electrical signal corresponding to the right turn light circuitry, the sixth meter further displays a peak left turn electrical signal corresponding to the left turn light circuitry, the seventh meter further displays a peak second electrical signal corresponding to an electrical output of the first lift gate circuitry, the eighth meter further displays a peak third electrical signal corresponding to the electrical output of the second lift gate circuitry, a ninth meter further displays a peak service brake air pressure signal corresponding to the service brake system, the tenth meter further displays a peak service brake leak down pressure signal corresponding to the service leak down brake system, the eleventh meter further displays a peak trolley brake pressure signal corresponding to the service trolley brake system, and the twelfth meter further displays a peak pressure signal corresponding to the emergency air line.

In embodiments, the system includes a processor, and the plurality of meters include a first input corresponding to a test to be performed and/or executed by the processor on the first circuitry of a tractor trailer, a second input corresponding to a test to be performed and/or executed by the processor on the first lift gate circuitry of a tractor trailer, a third input corresponding to a test to be performed and/or executed by the processor on the second lift gate circuitry of a tractor trailer, a fourth input corresponding to a test to be performed and/or executed by the processor on the service air line of a tractor trailer, and a fifth input corresponding to a test to be performed and/or executed by the processor on the emergency air line of a tractor trailer; wherein actuation of an input causes the processor to perform and/or execute the test corresponding to that input and an electrical signal or a pressure signal corresponding to the test to be transmitted and displayed on the corresponding meter.

In some embodiments, the test executed on the first circuitry comprises querying the circuit board to provide an updated first electrical signal, the test executed on the first lift gate circuitry comprises querying the circuit board to provide an updated second electrical signal, the test executed on the second lift gate circuitry comprises querying the circuit board to provide an updated third electrical signal, the test executed on the service air line comprises querying the circuit board to provide an updated first pressure signal, and the test executed on the emergency air line comprises querying the circuit board to provide an updated second pressure signal.

In certain embodiments, the fourth input comprises a test to be performed by the processor on a service leak down brake system of the service air line, wherein the test comprises querying the circuit board to monitor a service brake leak down pressure of the brakes over 60 seconds and determine the delta of the leak down pressure over the 60 seconds. In embodiments, the delta is transmitted to the electronic device. In some embodiments, if the delta is greater than or equal to four pounds per square inch, the processor causes the display on the meter corresponding to the fourth input to indicate that the test has been failed.

Also disclosed herein is a method of testing a tractor trailer including connecting a seven-way tractor trailer plug of a tractor trailer to a seven-way tractor trailer plug port of a housing, connecting a service air line of the tractor trailer to a service air line port of the housing, connecting an emergency air line of the tractor trailer to an emergency air line port of the housing, powering the tractor trailer while the seven-way tractor trailer plug, the service air line, and the emergency air line are connected to the housing, querying an electrical signal of the seven-way tractor trailer plug, a first pressure signal of the service air line, and a second pressure signal of the emergency air line, receiving the electrical signal, the first pressure signal, and the second pressure signal, wirelessly transmitting the electrical signal, the first pressure signal, and the second pressure to an electronic device, and displaying the electrical signal, the first pressure signal, and the second pressure signal on the electronic device.

In some embodiments, the method includes connecting a two-pole charger of the tractor trailer to a two-pole charge port of the housing, connecting a single-pole charger of the tractor trailer to a single-pole charge port of the housing, querying an electrical signal of the two-pole charger and an electrical signal of the single-pole charger, receiving the electrical signal of the two-pole charger and the electrical signal of the single-pole charger, wirelessly transmitting the electrical signal of the two-pole charger and the electrical signal of the single-pole charger, and displaying the electrical signal of the two-pole charger and the electrical signal of the single-pole charger on the electronic device.

In certain embodiments, the method includes querying a pressure signal of the service air line over 60 seconds, determining the change in the pressure signal of the service air line over the 60 seconds, and wirelessly transmitting the change in the pressure signal to the electronic device.

In embodiments, if the change in pressure is greater than or equal to four pounds per square inch, then displaying on the electronic device that there is a service air line pressure failure, and if the change in pressure is less than four pounds per square inch, then displaying on the electronic device that the service air line pressure is in order.

In some embodiments, the method includes storing the transmitted electrical signals and pressure signals on a memory to compare results over a period.

For purposes of this disclosure, the following definitions are used. "Seven-way tractor trailer plug" is defined as "the male, seven pronged, or pinned, electrical connector for connection between a tractor trailer and the trailer(s) it tows, wherein each pin corresponds to either of the auxiliary light circuitry, the tail/running light circuitry, the clearance/marker light circuitry, the brake light circuitry, the right turn light circuitry, the left turn light circuitry of the respective tractor trailer, and the ground." "Seven-way tractor trailer plug port" is defined as "the female, seven-slotted electrical receptacle for connection between a tractor trailer and the trailer(s) it tows, wherein each slot corresponds to the prong, or pin, of a seven-way tractor trailer plug and is configured to receive an electrical input therefrom." "Service air line" is also known as the "control line" or "signal line" is defined as "the air line that carries air controlled by the foot brake or the trailer hand brake of a tractor trailer." "Emergency air line" also known as the "supply line" is defined as "the air line that supplies air to the trailer air tanks, and that control the emergency brakes on combination vehicles, such as a tractor trailer, of which a loss of air pressure causes the trailer emergency brakes to come on." "Service air line port" is defined as "a receptacle for receiving the service air line of a tractor trailer and any pressure input applied thereto from the service air line." "Emergency air line port" is defined as "a receptacle for receiving the emergency air line of a tractor trailer and any pressure input applied thereto from the emergency air line." "Circuit board" is defined as "a board containing an electric circuit and/or a printed circuit, hardware, and/or a processor for carrying out instructions or sending and/or querying signals." "Logic" is defined as (i) logic implemented as computer instructions and/or data within one or more computer processes and/or (ii) logic implemented in electronic circuitry. "Computer-readable medium" is defined as is a medium capable of storing data in a format readable by a mechanical device and excludes any transitory signals, but includes any non-transitory data storage circuitry, e.g., buffers, cache, and queues, within transceivers of transitory signals." "Processor" is defined as a machine, device, apparatus, or process that processes something, such as a computer processor or central processing unit". "Query" is defined as "a question for information, data, or signals made by a computer system that is processed and executed by a processor." "Circuitry" is defined as "a circuit or system of circuitry performing a particular function in a system or electronic device." "Graphic user interface" or "GUI" is defined as "a computer program and or interface on an electronic device, such as a computer, smart phone, or tablet, that includes one or more inputs and/or outputs, which allow a user to interact with the electronic device." "Input" is defined as "what is put in, taken in, or operated on by any process or system, or the place where, or a device through which, energy, information, or instructions enter a system." "Output" is defined as "the amount of something produced by a person, device, machine, apparatus, system, or process, or the place where, or a device through which, energy, information, instructions leave a system." "Meter" is defined as "a display or device that measures and/or records the quantity, degree, or rate of something, such as an output or signal." "Wireless transceiver" is defined as "a combination transmitter and receiver device, apparatus, or system for wireless communication therebetween. "Power" is defined as "energy that is produced by mechanical, electrical, or other means and used to operate a device." "Actuate" is defined as "to cause a machine, device, apparatus, or process to operate." "Delta" is defined as "the change or variation of a variable, e.g., measurement or number, or function."

Any device or step to a method described in this disclosure can comprise or consist of that which it is a part of, or the parts which make up the device or step. The term "and/or" is inclusive of the items which it joins linguistically and each item by itself. "Substantially" is defined as at least 95% of the term being described and/or "within a tolerance level known in the art and/or within 5% thereof. Any device or aspect of a device or method described herein can be read as "comprising" or "consisting" thereof.

DETAILED DESCRIPTION OF EMBODIMENTS OF THE DISCLOSED TECHNOLOGY

The present disclosed technology provides a system and method for testing a tractor trailer. The system includes a housing having various tractor trailer connections, such as a seven-way tractor trailer plug port, a service air line port and an emergency air line port, a circuit board coupled to the various connections that generates electrical signals and pressure signals corresponding to the various connections, an electronic device including a GUI for displaying the electrical signals and pressure signals generated by the circuit board, a wireless transceiver coupled to the circuit board for transmitting the electrical signals and pressure signals to the electronic device, and a memory to store the transmitted electrical signals and pressure signals. The method includes connecting a seven-way tractor trailer plug of a tractor trailer to a seven-way tractor trailer plug port of the housing, connecting a service air line of the tractor trailer to a service air line port of the housing, connecting an emergency air line of the tractor trailer to an emergency air line port of the housing, powering the tractor trailer while the seven-way tractor trailer plug, the service air line, and the emergency air line are connected to the housing, querying an electrical signal of the seven-way tractor trailer plug, a first pressure signal of the service air line, and a second pressure signal of the emergency air line, receiving the electrical signal, the first pressure signal, and the second pressure signal, wirelessly transmitting the electrical signal, the first pressure signal, and the second pressure to an electronic device, and displaying the electrical signal, the first pressure signal, and the second pressure signal on the electronic device.

Figure 1:
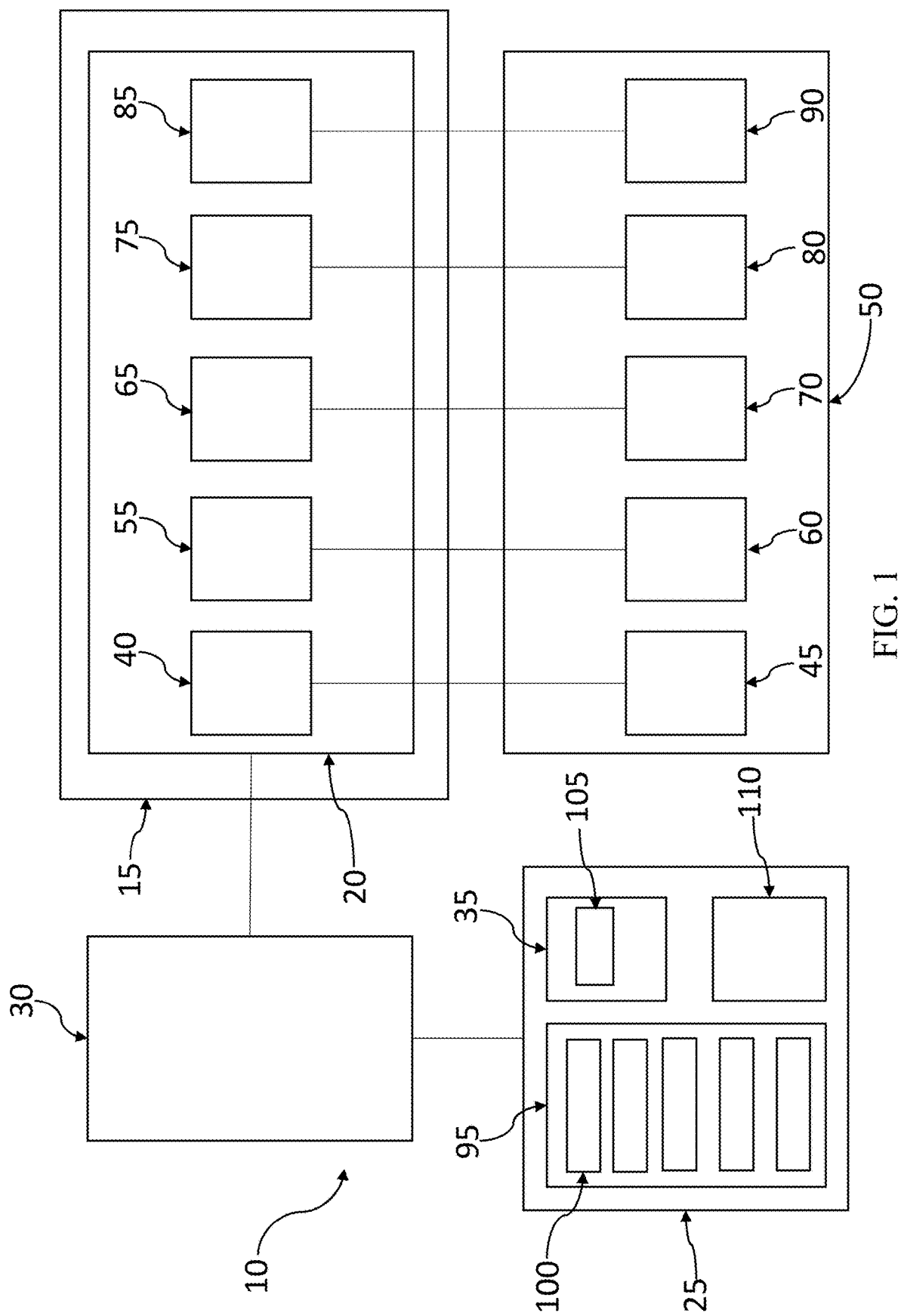
FIG. 1 shows a block diagram of the system of the present disclosed technology according to one embodiment.
Figure 2:
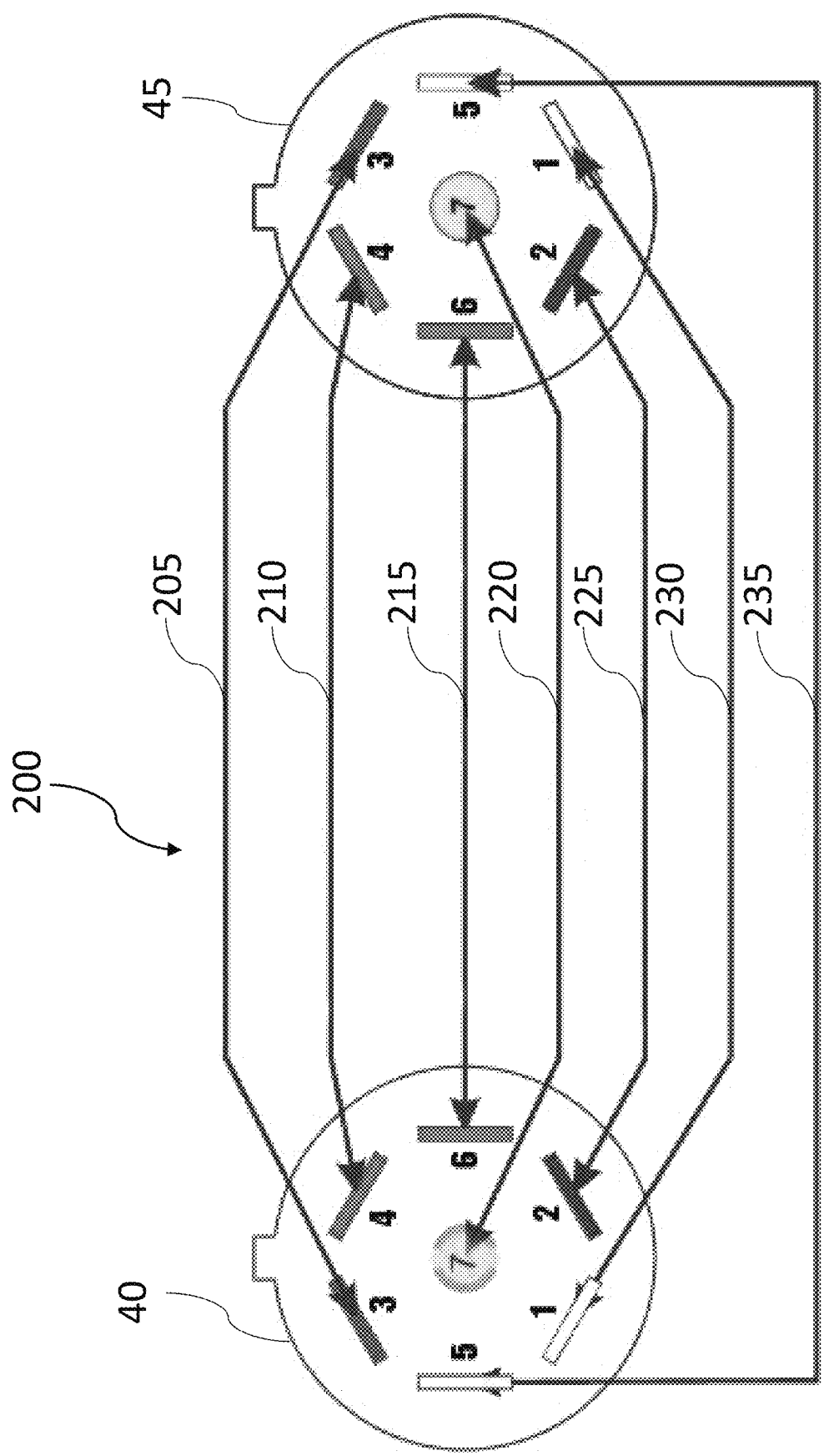
FIG. 2 shows a pin diagram of the seven-way tractor trailer plug port and the corresponding circuitry of a seven-way tractor trailer plug of the present disclosed technology according to one embodiment.

Referring now to FIGS. 1 and 2 simultaneously, FIG. 1 shows a block diagram of the system of the present disclosed technology according to one embodiment. FIG. 2 shows a pin diagram of the seven-way tractor trailer plug port and the corresponding circuitry of a seven-way tractor trailer plug of the present disclosed technology according to one embodiment. The present disclosed technology comprises a system 10 for testing and diagnosing the controls of a tractor trailer, such as the electrical system, e.g., auxiliary light circuitry, tail/running light circuitry, clearance/marker light circuitry, brake light circuitry, right turn light circuitry, left turn light circuitry, and lift gate circuitry, and the ABS. The system 10 comprises a housing 15, a circuit board 20, an electronic device 25, a wireless transceiver 30, and a memory 35. The housing 15 comprises a seven-way tractor trailer plug port electrically connectable to a seven-way tractor trailer plug 45 corresponding to a first circuitry 200 of a tractor trailer 50, as shown in FIG. 2, a two-pole charge port 55 electrically connectable to a two-pole charger 60 corresponding to a first lift gate circuitry of the tractor trailer 50, a single-pole charge port 65 electrically connectable to a single-pole charger 70 corresponding to a second lift gate circuitry of the tractor trailer 50, a service air line port 75 electrically connectable to a service air line 80 of the tractor trailer 50, and an emergency air line port 85 electrically connectable to an emergency air line 90 of the tractor trailer 50.

In embodiments, the first circuitry 200 of the tractor trailer 50 includes the auxiliary light circuitry 205, the tail/running light circuitry 210, the clearance/marker light circuitry 215, the brake light circuitry 220, the right turn light circuitry 225, the left turn light circuitry 230, and a ground 235, as shown in FIG. 2.

In embodiments, the circuit board 20 is coupled to the seven-way tractor trailer plug port 40, the two-pole charge port 55, the single-pole charge port 65, the service air line port 75, and the emergency air line port 85. In some embodiments, the circuit board is a printed circuit board, such as, for example, a single-sided printed circuit board, a double-sided printed circuit board, multilayer printed circuit board, rigid printed circuit board, a flexible printed circuit board, and a rigid-flexible printed circuit board. The circuit board 20 generates a first electrical signal corresponding to an electrical output of the first circuitry 200 of the tractor trailer 50, a second electrical signal corresponding to an electrical output of the first lift gate circuitry of the tractor trailer 50, and a third electrical signal corresponding to an electrical output of the second lift gate circuitry of the tractor trailer 50. In some embodiments, the circuit board 20 generates a first pressure signal corresponding to a pressure output of the service air line 80 of the tractor trailer 50, and a second pressure signal corresponding to a pressure output of the emergency air line 90 of the tractor trailer 50.

In embodiments, the first electrical signal comprises an auxiliary light electrical signal corresponding to an electrical output of the auxiliary light circuitry 205, a tail/running light electrical signal corresponding to an electrical output of the tail/running light circuitry 210, a clearance/marker light electrical signal corresponding to an electrical output of the clearance/marker light circuitry 215, a brake light electrical signal corresponding to an electrical output of the brake light circuitry 220, a right turn electrical signal corresponding to an electrical output of the right turn light circuitry 225, and a left turn electrical signal corresponding to an electrical output of the left turn light circuitry 230.

In embodiments, the first pressure signal comprises a service brake air pressure signal corresponding to a pressure output of the service brake system of the tractor trailer 50, a service brake leak down pressure signal corresponding to a pressure output of the service leak down brake system of the tractor trailer 50, and a trolley brake pressure signal corresponding to a pressure output of the service trolley brake system of the tractor trailer 50.

In embodiments, the electronic device 25 comprises a graphic user interface 95 comprising a plurality of meters 100. The plurality of meters 100 are a series of displays, prompts, and/or outputs corresponding to the first circuitry 200 of the tractor trailer 50, the first lift gate circuitry of the tractor trailer 50, the second lift gate circuitry of the tractor trailer 50, the service air line 80 of the tractor trailer 50, and the emergency air line 90 of the tractor trailer 50. Each of the plurality of meters 100 displays the corresponding electrical signal or pressure signal of the first circuitry 200 of the tractor trailer 50, the first lift gate circuitry of the tractor trailer 50, the second lift gate circuitry of the tractor trailer 50, the service air line 80 of the tractor trailer 50, and the emergency air line 90 of the tractor trailer 50.

In embodiments, the plurality of meters 100 include a first meter corresponding to the auxiliary light circuitry 205, a second meter corresponding to the tail/running light circuitry 210, a third meter corresponding to the clearance marker light electrical circuitry 215, a fourth meter corresponding to the brake light circuitry 220, a fifth meter corresponding to the right turn light circuitry 225, a sixth meter corresponding to the left turn light circuitry 230, a seventh meter corresponding to the first lift gate circuitry, an eighth meter corresponding to the second lift gate circuitry, a ninth meter corresponding to the service brake system of the tractor trailer 50, a tenth meter corresponding to the service leak down brake system of the tractor trailer 50, an eleventh meter corresponding to the trolley brake system of the tractor trailer 50, and a twelfth meter corresponding to the emergency air line 90 of the tractor trailer 50.

In embodiments, the first meter displays the auxiliary light electrical signal corresponding to the auxiliary light circuitry 205, the second meter displays the tail/running light electrical signal corresponding to the tail/running light circuitry 210, the third meter displays the clearance/marker light electrical signal corresponding to the clearance/marker light circuitry 215, the fourth meter displays the brake light electrical signal corresponding to the brake light circuitry 220, the fifth meter displays the right turn electrical signal corresponding to the right turn light circuitry 225, the sixth meter displays the left turn electrical signal corresponding to the left turn light circuitry 230, the seventh meter displays the second electrical signal corresponding to the electrical output of the first lift gate circuitry, the eighth meter displays the third electrical signal corresponding to the electrical output of the second lift gate circuitry, a ninth meter displays the service brake air pressure signal corresponding to the service brake system, the tenth meter displays the service brake leak down pressure signal corresponding to the service leak down brake system, the eleventh meter displays the trolley brake pressure signal corresponding to the service trolley brake system, and the twelfth meter displays the pressure signal corresponding to the emergency air line 90.

In some embodiments, the first meter further displays a peak auxiliary light electrical signal corresponding to the auxiliary light circuitry 205, the second meter further displays a peak tail/running light electrical signal corresponding to the tail/running light circuitry 210, the third meter further displays a peak clearance/marker light electrical signal corresponding to the clearance/marker light circuitry 215, the fourth meter further displays a peak brake light electrical signal corresponding to the brake light circuitry 220, the fifth meter further displays a peak right turn electrical signal corresponding to the right turn light circuitry 225, the sixth meter further displays a peak left turn electrical signal corresponding to the left turn light circuitry 230, the seventh meter further displays a peak second electrical signal corresponding to an electrical output of the first lift gate circuitry, the eighth meter further displays a peak third electrical signal corresponding to the electrical output of the second lift gate circuitry, a ninth meter further displays a peak service brake air pressure signal corresponding to the service brake system, the tenth meter further displays a peak service brake leak down pressure signal corresponding to the service leak down brake system, the eleventh meter further displays a peak trolley brake pressure signal corresponding to the service trolley brake system, and the twelfth meter further displays a peak pressure signal corresponding to the emergency air line 90.

In embodiments, the wireless transceiver 30 is coupled to the circuit board 20. The wireless transceiver 30 transmits the electrical signals and/or the pressure signals generated by the circuit board 20 wirelessly to the electronic device. In some embodiments, the wireless transceiver 30 communicates wirelessly via Bluetooth or a close-range communication network. In embodiments, the wireless transceiver 30 is disposed in the housing 15. In other embodiments, the wireless transceiver 30 is partially disposed in the housing 15 and partially disposed in the electronic device 25, e.g., the transmitter in the housing 15 and receiver in the electronic device 25, or vice versa.

In embodiments, the memory 35 stores the transmitted electrical signals and pressure signals. In some embodiments, the memory 35 stores the transmitted electrical signals and pressure signals on the electronic device 25. In other embodiments, the memory 35 is disposed in the housing 15 and coupled to the circuit board 20 such that the memory 35 stores can store the electrical signals and pressure signals in the housing 15. In embodiments, the memory 35 includes one or more logic 105 that is a series of instructions and/or code that is executed by a processor 110.

In embodiments, power provided by the tractor trailer 50 causes the circuit board 20 to receive an electrical output of the first circuitry 200, an electrical output of the first lift gate circuitry, and an electrical output of the second lift gate circuitry. Power provided by the tractor trailer 50 can be electric power initiated by starting the tractor trailer or turning on the battery of the vehicle. When the tractor trailer is powered, the circuit board 20 causes the wireless transceiver 30 to transmit the first electrical signal corresponding to the electrical output of the first circuitry 200, the second electrical signal corresponding to the electrical output of the first lift gate circuitry of the tractor trailer 50, and the third electrical signal corresponding to the electrical output of the second lift gate circuitry of the tractor trailer 50 to the electronic device 25.

In embodiments, applying pressure to a brake or brakes of the tractor trailer 50 causes the circuit board 20 to receive a pressure output of the service air line 80 of the tractor trailer 50, and a pressure output of the emergency air line 90 of the tractor trailer 50. When pressure is applied to a brake, the circuit board 20 causes the wireless transceiver 30 to transmit the first pressure signal corresponding to the pressure output of the service air line 80 and the second pressure signal corresponding to the pressure output of the emergency air line 90 to the electronic device 25.

In embodiments, the plurality of meters 100 include a first input, a second input, a third input, a fourth input, and a fifth input. The first input corresponds to a test of the logic 105, which when executed by the processor 110 queries the circuit board 20 to provide an updated first electrical signal of the first circuitry 200 of the tractor trailer 50. The second input corresponds to a test of the logic 105, which when executed by the processor 110 queries the circuit board 20 to provide an updated second electrical signal of the first lift gate circuitry of the tractor trailer 50. The third input corresponds to a test of the logic 105, which when executed by the processor 110 to be executed by the processor queries the circuit board 20 to provide an updated third electrical signal on the second lift gate circuitry of the tractor trailer 50. The fourth input corresponds to a test of the logic 105, which when executed by the processor 110 queries the circuit board 20 to provide an updated first pressure signal of the service air line 80 of the tractor trailer 50. The fifth input corresponds to a test of the logic 105, which when executed by the processor 110 queries the circuit board 20 to provide an updated second pressure signal of the emergency air line 90 of the tractor trailer 50. Each of the first, second, third, fourth, and fifth inputs are actuable. Actuation of an input causes the processor 110 to execute the test of the logic 105, which corresponds to the actuated input. Querying the circuit board 20 causes the updated electrical signal or updated pressure signal corresponding to the test to be transmitted and displayed on the corresponding meter 100.

In some embodiments, the fourth input comprises an additional or separate test of the logic 105, which when executed by the processor 110, queries the circuit board 20 to monitor a service brake leak down pressure of the service air line 80 over a period of time and determine the delta, or change, in the service brake leak down pressure over the period of time. In one embodiment, the test comprises querying the circuit board 20 to monitor the service brake leak down pressure over 60 seconds and determine the delta of the leak down pressure over the 60 seconds. In embodiments, the delta of the leak down pressure over the period of time is transmitted to the electronic device. If the delta is greater than or equal to four pounds per square inch, the logic 105 and/or the processor 110 causes the display on the meter corresponding to the fourth input to indicate that the test has been failed. In embodiments, for example, this can be indicia on the meter reading "Fail," "Failed," "Issue," and/or "Problem." In other embodiments, if the delta is greater than or equal to four pounds per square inch, the logic 105 and/or processor 110 causes the display on the meter corresponding to the fourth input to indicate the individual or user performing the test to run the test again.

Figure 3:
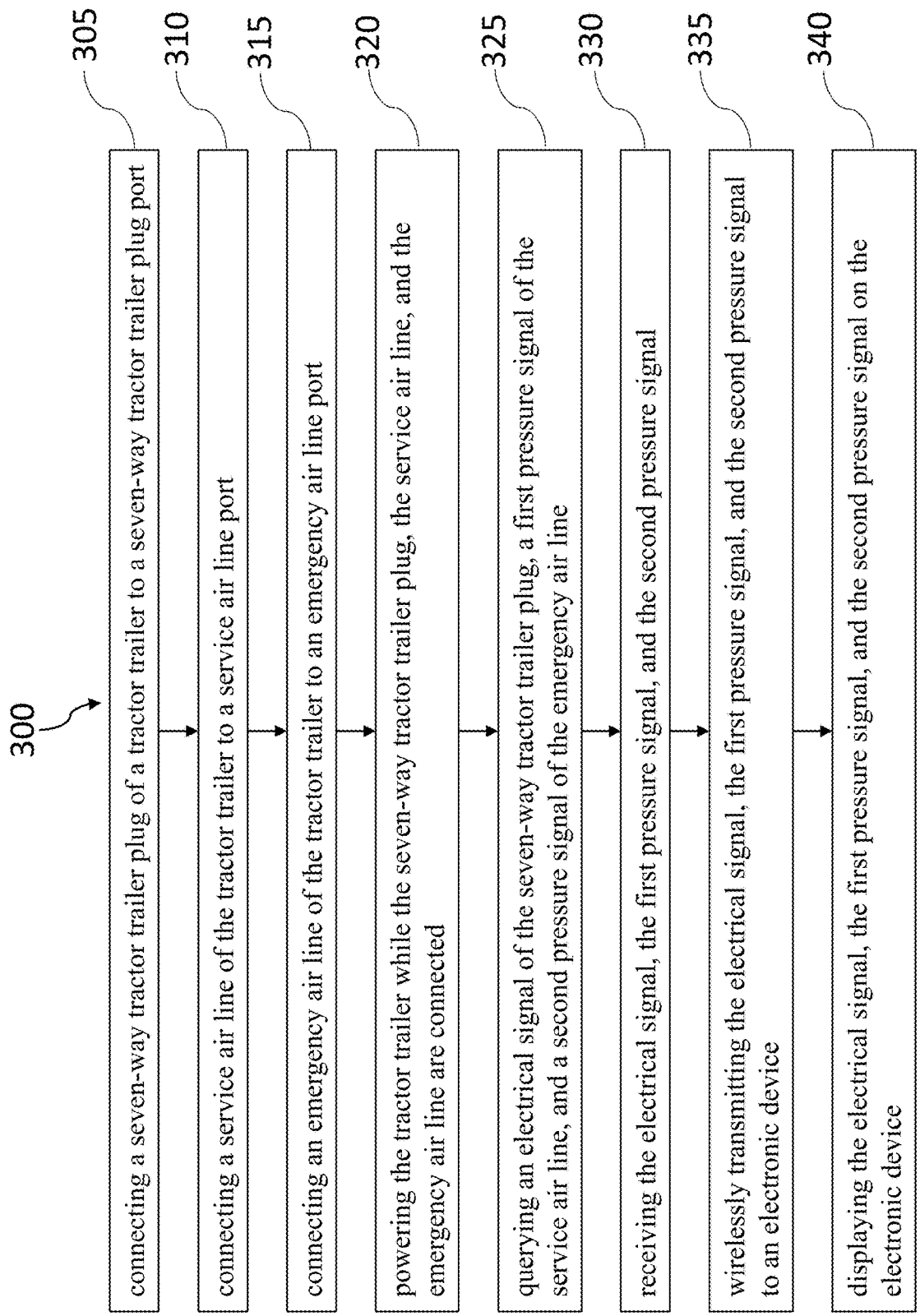
FIG. 3 shows a flow chart of the method of the present disclosed technology according to one embodiment.

Referring now to FIG. 3, there is shown a flow chart of the method of the present disclosed technology according to one embodiment. The present disclosed technology comprises a method 300 of testing and diagnosing the controls of a tractor trailer, such as the electrical system and the ABS. The method 300 comprises connecting a seven-way tractor trailer plug of a tractor trailer to a seven-way tractor trailer plug port of a housing 305, connecting a service air line of the tractor trailer to a service air line port of the housing 310, connecting an emergency air line of the tractor trailer to an emergency air line port of the housing 315, powering the tractor trailer while the seven-way tractor trailer plug, the service air line, and the emergency air line are connected to the housing 320, querying an electrical signal of the seven-way tractor trailer plug, a first pressure signal of the service air line, and a second pressure signal of the emergency air line 325, receiving the electrical signal, the first pressure signal, and the second pressure signal 330, wirelessly transmitting the electrical signal, the first pressure signal, and the second pressure to an electronic device 335, and displaying the electrical signal, the first pressure signal, and the second pressure signal on the electronic device 340.

In embodiments, the method 300 includes connecting a two-pole charger of the tractor trailer to a two-pole charge port of the housing, connecting a single-pole charger of the tractor trailer to a single-pole charge port of the housing, querying an electrical signal of the two-pole charger and an electrical signal of the single-pole charger, receiving the electrical signal of the two-pole charger and the electrical signal of the single-pole charger, wirelessly transmitting the electrical signal of the two-pole charger and the electrical signal of the single-pole charger, and displaying the electrical signal of the two-pole charger and the electrical signal of the single-pole charger on the electronic device.

In some embodiments, the method 300 comprises querying a pressure signal of the service air line over a period of time, determining the change in the pressure signal of the service air line over the period of time, and wirelessly transmitting the change in the pressure signal to the electronic device. In one embodiment, the method comprises querying the pressure signal of the service air line over a period of 60 seconds and determining the change in the pressure signal over the 60 seconds. In embodiments, if the change in pressure is greater than or equal to four pounds per square inch, then displaying on the electronic device that there is a service air line pressure failure. If the change in pressure is less than four pounds per square inch, displaying on the electronic device that the service air line pressure is in order, or that the corresponding service air line brake is working properly. In embodiments, the method 300 includes storing the transmitted electrical signals and pressure signals on a memory to compare results, e.g., the pressure signals and or electrical signals, over a period of time.

The present technology can be carried out with one or more of the embodiments described. The drawings show embodiments with the understanding that the present description is to be considered an exemplification of the principles and is not intended to be exhaustive or to limit the disclosure to the details of construction. The arrangements of the components are set forth in the following description or illustrated in the drawings.

While the disclosed technology has been taught with specific reference to the above embodiments, a person having ordinary skill in the art will recognize that changes can be made in form and detail without departing from the spirit and the scope of the disclosed technology. The described embodiments are to be considered in all respects only as illustrative and not restrictive. All changes that come within the meaning and range of equivalency of the claims are to be embraced within their scope. Combinations of any of the methods, systems, and devices described herein-above are also contemplated and within the scope of the disclosed technology.

I claim:

1. A tractor trailer testing system, comprising:
a housing including a seven-way tractor trailer plug port, a two-pole charge port, a single-pole charge port, a service air line port, and an emergency air line port;
a circuit board coupled to the seven-way tractor trailer plug port, the two-pole charge port, the single-pole charge port, the service air line port, and the emergency air line port, the circuit board to generate electrical signals related to a first circuitry of a tractor trailer, a first lift gate circuitry of a tractor trailer, and a second lift gate circuitry of a tractor trailer, and the circuit board to generate pressure signals related to a service air line of a tractor trailer and an emergency air line of a tractor trailer;
an electronic device including a graphic user interface comprising a plurality of meters corresponding to the first circuitry, the first lift gate circuitry, the second lift gate circuitry, the service air line, and the emergency air line, the plurality of meters displaying the electrical signals and pressure signals generated by the circuit board;
a wireless transceiver coupled to the circuit board to transmit the electrical signals and pressure signals to the electronic device;
and a memory to store the transmitted electrical signals and pressure signals.

2. A tractor trailer testing system, comprising:
a housing including a seven-way tractor trailer plug port electrically connectable to a seven-way tractor trailer plug corresponding to a first circuitry of a tractor trailer, a two-pole charge port electrically connectable to a two-pole charger corresponding to a first lift gate circuitry of a tractor trailer, a single-pole charge port electrically connectable to a single-pole charger corresponding to a second lift gate circuitry of a tractor trailer, a service air line port electrically connectable to a service air line of a tractor trailer, and an emergency air line port electrically connectable to an emergency air line of a tractor trailer;
a circuit board coupled to the seven-way tractor trailer plug port, the two-pole charge port, the single-pole charge port, the service air line port, and the emergency air line port, the circuit board to generate a first electrical signal corresponding to an electrical output of the first circuitry, a second electrical signal corresponding to an electrical output of the first lift gate circuitry, and a third electrical signal corresponding to an electrical output of the second lift gate circuitry, and the circuit board to generate a first pressure signal corresponding to a pressure output of the service air line, and a second pressure signal corresponding to a pressure output of the emergency air line;
an electronic device including a graphic user interface comprising a plurality of meters, the plurality of meters corresponding to the first circuitry, the first lift gate circuitry, the second lift gate circuitry, the service air line, and the emergency air line, each of the plurality of meters to display the corresponding electrical signal or pressure signal of the first circuitry, the first lift gate circuitry, the second lift gate circuitry, the service air line, and the emergency air line;

a wireless transceiver coupled to the circuit board, the wireless transceiver to transmit the electrical signal and the pressure signal generated by the circuit board wirelessly to the electronic device; and a memory to store the transmitted electrical signal and pressure signal.

3. The system of claim 2, wherein:

power provided by the tractor trailer causes the circuit board to receive an electrical output of the first circuitry, an electrical output of the first lift gate circuitry, and an electrical output of the second lift gate circuitry; and the circuit board causes the wireless transceiver to transmit the first electrical signal corresponding to the electrical output of the first circuitry, the second electrical signal corresponding to the electrical output of the first lift gate circuitry, and the third electrical signal corresponding to the electrical output of the second lift gate circuitry to the electronic device.

4. The system of claim 3, wherein:

applying pressure to a brake of the tractor trailer causes the circuit board to receive a pressure output of the service air line, and a pressure output of the emergency air line; and the circuit board causes the wireless transceiver to transmit the first pressure signal corresponding to the pressure output of the service air line and the second pressure signal corresponding to the pressure output of the emergency air line to the electronic device.

5. The system of claim 4, wherein the first circuitry of the tractor trailer includes an auxiliary light circuitry, a tail/running light circuitry, a clearance/marker light circuitry, a brake light circuitry, a right turn light circuitry, and a left turn light circuitry.

6. The system of claim 5, wherein the first electrical signal comprises an auxiliary light electrical signal corresponding to an electrical output of the auxiliary light circuitry, a tail/running light electrical signal corresponding to an electrical output of the tail/running light circuitry, a clearance/marker light electrical signal corresponding to an electrical output of the clearance/marker light circuitry, a brake light electrical signal corresponding to an electrical output of the brake light circuitry, a right turn electrical signal corresponding to an electrical output of the right turn light circuitry, and a left turn electrical signal corresponding to an electrical output of the left turn light circuitry.

7. The system of claim 6, wherein the first pressure signal comprises a service brake air pressure signal corresponding to a pressure output of the service brake system of the tractor trailer, a service brake leak down pressure signal corresponding to a pressure output of the service leak down brake system of the tractor trailer, and a trolley brake pressure signal corresponding to a pressure output of the service trolley brake system of the tractor trailer.

8. The system of claim 7, wherein the plurality of meters include a first meter corresponding to the auxiliary light circuitry, a second meter corresponding to the tail/running light circuitry, a third meter corresponding to the clearance marker light electrical circuitry, a fourth meter corresponding to the brake light circuitry, a fifth meter corresponding to the right turn light circuitry, a sixth meter corresponding to the left turn light circuitry, a seventh meter corresponding to the first lift gate circuitry, an eighth meter corresponding to the second lift gate circuitry, a ninth meter corresponding to the service brake system of the tractor trailer, a tenth meter corresponding to the service leak down brake system of the tractor trailer, an eleventh meter corresponding to the trolley brake system of the tractor trailer, and a twelfth meter corresponding to the emergency air line of the tractor trailer.

9. The system of claim 8, wherein the first meter displays the auxiliary light electrical signal corresponding to the auxiliary light circuitry, the second meter displays the tail/running light electrical signal corresponding to the tail/running light circuitry, the third meter displays the clearance/marker light electrical signal corresponding to the clearance/marker light circuitry, the fourth meter displays the brake light electrical signal corresponding to the brake light circuitry, the fifth meter displays the right turn electrical signal corresponding to the right turn light circuitry, the sixth meter displays the left turn electrical signal corresponding to the left turn light circuitry, the seventh meter displays the second electrical signal corresponding to the electrical output of the first lift gate circuitry, the eighth meter displays the third electrical signal corresponding to the electrical output of the second lift gate circuitry, a ninth meter displays the service brake air pressure signal corresponding to the service brake system, the tenth meter displays the service brake leak down pressure signal corresponding to the service leak down brake system, the eleventh meter displays the trolley brake pressure signal corresponding to the service trolley brake system, and the twelfth meter displays the pressure signal corresponding to the emergency air line.

10. The system of claim 9, wherein the first meter further displays a peak auxiliary light electrical signal corresponding to the auxiliary light circuitry, the second meter further displays a peak tail/running light electrical signal corresponding to the tail/running light circuitry, the third meter further displays a peak clearance/marker light electrical signal corresponding to the clearance/marker light circuitry, the fourth meter further displays a peak brake light electrical signal corresponding to the brake light circuitry, the fifth meter further displays a peak right turn electrical signal corresponding to the right turn light circuitry, the sixth meter further displays a peak left turn electrical signal corresponding to the left turn light circuitry, the seventh meter further displays a peak second electrical signal corresponding to an electrical output of the first lift gate circuitry, the eighth meter further displays a peak third electrical signal corresponding to the electrical output of the second lift gate circuitry, a ninth meter further displays a peak service brake air pressure signal corresponding to the service brake system, the tenth meter further displays a peak service brake leak down pressure signal corresponding to the service leak down brake system, the eleventh meter further displays a peak trolley brake pressure signal corresponding to the service trolley brake system, and the twelfth meter further displays a peak pressure signal corresponding to the emergency air line.

11. The system of claim 2, further comprising a processor, wherein:

the plurality of meters include a first input corresponding to a test to be executed by the processor on the first circuitry of a tractor trailer, a second input corresponding to a test to be executed by the processor on the first lift gate circuitry of a tractor trailer, a third input corresponding to a test to be executed by the processor on the second lift gate circuitry of a tractor trailer, a fourth input corresponding to a test to be executed by the processor on the service air line of a tractor trailer, and a fifth input corresponding to a test to be executed by the processor on the emergency air line of a tractor trailer; and actuation of an input causes the processor to execute the test corresponding to that input and an electrical signal or a pressure signal corresponding to the test to be transmitted and displayed on the corresponding meter.

12. The system of claim 11, wherein:
the test executed on the first circuitry comprises querying the circuit board to provide an updated first electrical signal;
the test executed on the first lift gate circuitry comprises querying the circuit board to provide an updated second electrical signal
the test executed on the second lift gate circuitry comprises querying the circuit board to provide an updated third electrical signal;
the test executed on the service air line comprises querying the circuit board to provide an updated first pressure signal; and
the test executed on the emergency air line comprises querying the circuit board to provide an updated second pressure signal.

13. The system of claim 11, wherein:
the fourth input comprises a test to be executed by the processor on a service leak down brake system of the service air line; and
the test comprises querying the circuit board to monitor a service brake leak down pressure of the brakes over 60 seconds and determine the delta of the service leak down pressure over the 60 seconds.

14. The system of claim 13, wherein the delta is transmitted to the electronic device.

15. The system of claim 14, wherein if the delta is greater than or equal to four pounds per square inch, the processor causes the display on the meter corresponding to the fourth input to indicate that the test has been failed.

16. A method of testing a tractor trailer, comprising:
connecting a seven-way tractor trailer plug of a tractor trailer to a seven-way tractor trailer plug port of a housing;
connecting a service air line of the tractor trailer to a service air line port of the housing;
connecting an emergency air line of the tractor trailer to an emergency air line port of the housing;
powering the tractor trailer while the seven-way tractor trailer plug, the service air line, and the emergency air line are connected to the housing;
querying an electrical signal of the seven-way tractor trailer plug, a first pressure signal of the service air line, and a second pressure signal of the emergency air line;
receiving the electrical signal, the first pressure signal, and the second pressure signal;
wirelessly transmitting the electrical signal, the first pressure signal, and the second pressure to an electronic device; and
displaying the electrical signal, the first pressure signal, and the second pressure signal on the electronic device.

17. The method of claim 16, further comprising:
connecting a two-pole charger of the tractor trailer to a two-pole charge port of the housing;
connecting a single-pole charger of the tractor trailer to a single-pole charge port of the housing;
querying an electrical signal of the two-pole charger and an electrical signal of the single-pole charger;
receiving the electrical signal of the two-pole charger and the electrical signal of the single-pole charger;
wirelessly transmitting the electrical signal of the two-pole charger and the electrical signal of the single-pole charger; and
displaying the electrical signal of the two-pole charger and the electrical signal of the single-pole charger on the electronic device.

18. The method of claim 16, further comprising:
querying a pressure signal of the service air line over 60 seconds;
determining the change in the pressure signal of the service air line over the 60 seconds; and
wirelessly transmitting the change in the pressure signal to the electronic device.

19. The method of claim 18, wherein:
if the change in pressure is greater than or equal to four pounds per square inch, displaying on the electronic device that there is a service air line pressure failure; and
if the change in pressure is less than four pounds per square inch, displaying on the electronic device that the service air line pressure is in order.

20. The method of claim 19, further comprising:
storing the transmitted electrical signals and pressure signals on a memory to compare results over a period of time.

* * * * *